US011257986B2

(12) United States Patent
Meyer et al.

(10) Patent No.: US 11,257,986 B2
(45) Date of Patent: Feb. 22, 2022

(54) BONDING OF PHOSPHOR CONVERTER EMITTERS

(71) Applicant: Lumileds LLC, San Jose, CA (US)

(72) Inventors: Jens Meyer, Aachen (DE); Hans-Helmut Bechtel, Aachen (DE); Matthias Heidemann, Aachen (DE)

(73) Assignee: Lumileds LLC, San Jose, CA (US)

(*) Notice: Subject to any disclaimer, the term of this patent is extended or adjusted under 35 U.S.C. 154(b) by 0 days.

(21) Appl. No.: 16/867,799

(22) Filed: May 6, 2020

(65) Prior Publication Data

US 2020/0388726 A1 Dec. 10, 2020

(30) Foreign Application Priority Data

Jun. 5, 2019 (EP) .................................. 19178430

(51) Int. Cl.
*H01L 33/50* (2010.01)
*H01L 33/44* (2010.01)
(Continued)

(52) U.S. Cl.
CPC .......... *H01L 33/44* (2013.01); *H01L 33/0066* (2013.01); *H01L 33/0075* (2013.01);
(Continued)

(58) Field of Classification Search
CPC ..... C09K 11/7706; C09K 11/08; C09K 11/02; G02B 5/20; H01L 33/50; H01L 33/44; H01L 33/0066; H01L 33/32; H01L 33/0075; H01L 33/0093; H01L 33/06; H01L 2933/0025; F21V 13/08; F21V 29/70; F21V 9/32; F21K 9/64; F21Y 2115/30; F21Y 2115/10; B82Y 20/00
See application file for complete search history.

(56) References Cited

U.S. PATENT DOCUMENTS 8,721,098 B2 * 5/2014 Bechtel ............... H01L 33/502
362/84
8,994,259 B2 * 3/2015 Tamaki .................... F21V 7/00
313/483
(Continued)

FOREIGN PATENT DOCUMENTS

DE WO-2019141480 A1 * 7/2019 ............. H01L 33/54
EP 2645433 A2 10/2013
(Continued)

OTHER PUBLICATIONS

European Search Report corresponding to EP 19 17 8430, dated Nov. 28, 2019, 2 pages.
(Continued)

*Primary Examiner* — Savitri Mulpuri

(57) ABSTRACT

Embodiments include a device having a component with a component surface; a phosphor converter body with a phosphor converter body surface facing the component surface; a plurality of particles between and in contact with the component surface and the phosphor converter body surface; and an inorganic coating on and in contact with at least a portion of the particles, at least a portion of the component surface, and at least a portion of the phosphor converter body surface, and a method making such device.

15 Claims, 6 Drawing Sheets

(51) Int. Cl.
　　　*H01L 33/00*　　(2010.01)
　　　*H01L 33/06*　　(2010.01)
　　　*H01L 33/32*　　(2010.01)

(52) U.S. Cl.
　　　CPC .......... *H01L 33/0093* (2020.05); *H01L 33/06* (2013.01); *H01L 33/32* (2013.01); *H01L 33/50* (2013.01); *H01L 33/502* (2013.01); *H01L 33/505* (2013.01); *H01L 33/507* (2013.01); *H01L 2933/0025* (2013.01)

(56) References Cited

U.S. PATENT DOCUMENTS

| | | | |
|---|---|---|---|
| 2005/0093008 A1* | 5/2005 | Suehiro | H01L 33/44 257/98 |
| 2007/0298250 A1* | 12/2007 | Weimer | C09K 11/025 428/336 |
| 2008/0121917 A1* | 5/2008 | Weisbuch | H01L 33/58 257/98 |
| 2018/0122993 A1 | 5/2018 | Camras et al. | |
| 2018/0313501 A1* | 11/2018 | Anc | H01L 33/644 |
| 2019/0093871 A1* | 3/2019 | Sato | C09K 11/7706 |
| 2019/0169494 A1* | 6/2019 | Nakamura | C09K 11/08 |
| 2019/0198564 A1* | 6/2019 | Tandon | F21S 41/153 |
| 2020/0142288 A1* | 5/2020 | Okuno | C09K 11/08 |
| 2020/0203567 A1* | 6/2020 | Basin | H01L 33/50 |
| 2021/0063652 A1* | 3/2021 | T ngring et al. | H01L 33/54 |
| 2021/0111316 A1* | 4/2021 | Lopez-Julia | H01L 33/30 |
| 2021/0111320 A1* | 4/2021 | Lopez-Julia | H01L 33/0075 |

FOREIGN PATENT DOCUMENTS

| | | | | |
|---|---|---|---|---|
| EP | 2645433 A3 | 1/2016 | | |
| NL | WO-2008007232 A2 * | 1/2008 | | H01L 33/44 |

OTHER PUBLICATIONS

From the EPO as the ISA, Notification of Transmittal of The International Search Report and the Written Opinion of the International Searching Authority, corresponding to PCT/EP2020/062258, dated Aug. 31, 2020, 12 pages.

The extended European search report corresponding to EP19178430.5 dated Dec. 6, 2019, 6 pages.

* cited by examiner

100

The prototypical ALD reaction:
trimethylaluminum (TMA) + water ⟶ alumina film
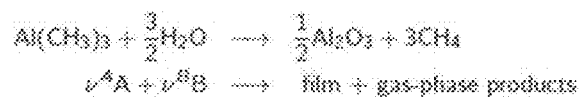
TMA exposure:
Water exposure:
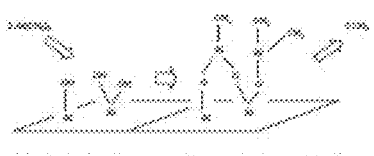
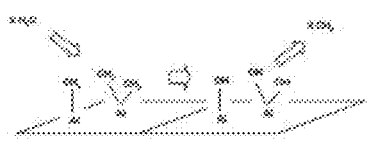
After Dillon, Ott, Way, and George Surf. Sci. (1995)
FIG. 6

BONDING OF PHOSPHOR CONVERTER EMITTERS

CROSS-REFERENCE TO RELATED APPLICATIONS

This application claims benefit of priority to European Patent Application 19178430.5 filed Jun. 5, 2019, which is incorporated herein by reference in its entirety.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer. Phosphors may be formed into a ceramic tile that is disposed in the path of light emitted by the LED.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties

BRIEF DESCRIPTION OF THE DRAWINGS

FIG. 6 is a diagram showing an ALD reaction.

DETAILED DESCRIPTION

This specification discloses a method that can be used to bond a phosphor converter to a substrate or light emitter, and a resulting device having a bonded phosphor converter attached. A phosphor converter can be bonded to a light emitter or substrate by introducing a layer of particles in combination with an inorganic coating between the phosphor converter and light emitter or substrate.

As used herein, spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below, depending on the orientation of the device. The device may be otherwise oriented (rotated 90 degrees or at other orientations) and the spatially relative descriptors used herein interpreted accordingly.

One method of forming a pcLED is to separately form a phosphor converting material into a plate or other shape to form a phosphor converter body. The phosphor converter body is then attached or bonded to a separately formed LED. Such phosphor converting bodies are known in the art and include, for example, Lumiramic™, as will be described in more detail below. The phosphor converter body is typically bonded to an LED or substrate through the use of a glue or silicone material that attaches the phosphor converter body to the LED. However, use of a glue or silicon has a number of disadvantages and may cause problems with the resulting device that reduce the applications and uses of the resulting device. Such disadvantages may include limited reliability of the resulting device due to silicone browning and/or, cracking and/or delamination; limited package efficiency; limited heat dissipation (higher droop); limited ability to tailor the emission spectrum or the device; limitations on the precision of dosing of phosphor and alignment of the phosphor converter plate or platelet on the LED; silicone curing steps with changes of rheology; and VOC incompatibility due to solvents and curing agents from the silicone.

Figure 1A:
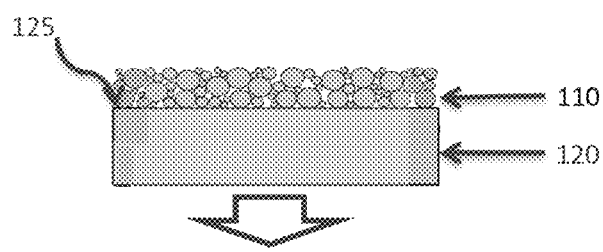
FIGS. 1a-1c illustrate bonding of a phosphor converter boy body to a light source.
Figure 1B:
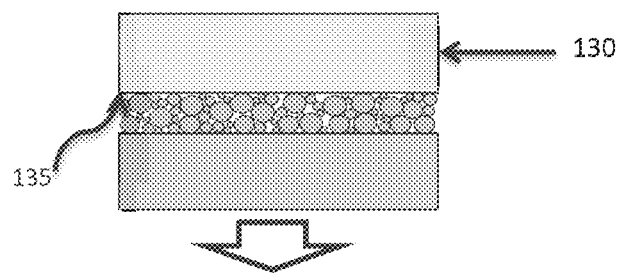
Figure 1C:
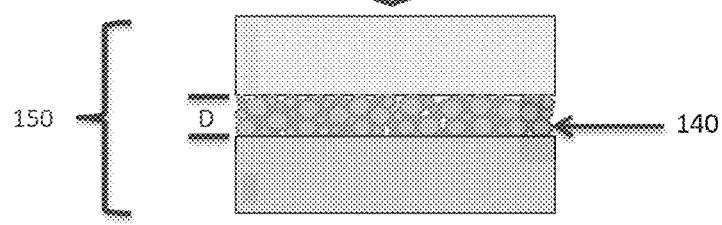
Figure 2:
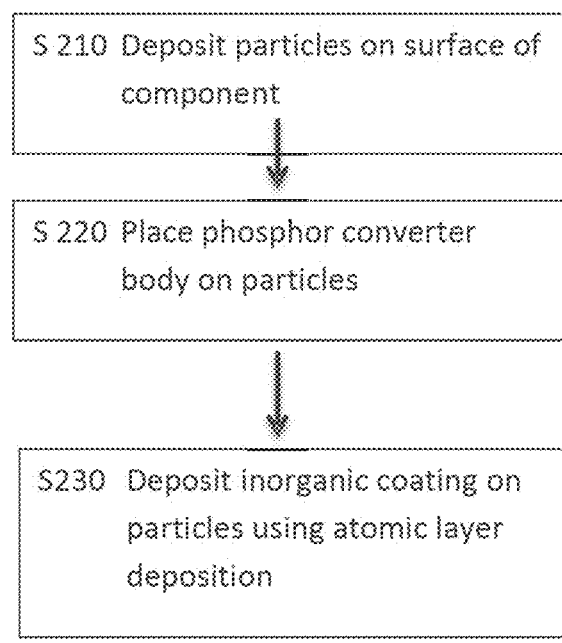
FIG. 2 is a flow diagram illustrating a method for bonding a phosphor converter body to a light source.

FIGS. 1 and 2 illustrate a method 100, 200 for bonding a phosphor converter body to a component to form a device.

As shown in FIG. 1a and S210 of FIG. 2, a layer of particles 110 are deposited on an upper surface 125 of a component 120 such that a portion of the particles 110 are in contact with surface 125.

As shown in FIG. 1b and S220 of FIG. 2, a phosphor converter body 130 is positioned on the particles 110, such that a lower surface 135 of the phosphor converter body 130 facing the component 120 is in contact with a portion of the particles 110.

As shown in FIG. 1c and S230 of FIG. 2, a thin layer of an inorganic coating 140 is applied. The thin layer of inorganic coating 140 coats particles 110 and forms a network of multiple connecting points between the phosphor converter body 130 and the component 120. Thus the thin layer of inorganic coating 140 connects particles 110 among each other and also the adjacent phosphor converter body 130 and component 120.

Inorganic coating 140 may be applied using atomic layer deposition (ALD), as will be described in more detail below, in which conformal and high quality coatings can be reached even on surfaces or gaps with large aspect-ratios, and which makes the ALD process in particular suitable for filling the space between the particles 110, component 120, and phosphor converter body 130 with inorganic coating 140.

Optionally, before performing the ALD of the inorganic coating 140, the top and sides of the component 120 and phosphor converter body 130 may be covered to prevent the inorganic coating 140 from coating those portions of the device 150. Alternatively, the ALD may be done without covering the phosphor converter 130 and component 120, and if desired a final polishing step, using for example chemical etching or mechanical polishing, may be performed to remove inorganic coating 140 from portions of the device 150 where it is not needed.

The resulting device 150 is a monolithic, silicone-free device architecture in which the phosphor converter body 130 is stably bonded to the component 120 by the intermediate layer of particles 110 and inorganic coating 140. Furthermore, bonding of the phosphor converter body 130 to the component 120 may be accomplished using the disclosed method without the addition of glue or silicone. Such a device has applications in, for example, automotive, general illumination, and flash light emitting devices and displays. In particular, because there is no glue or silicone to break down, such devices may be longer-lasting, and because of the additional stability provided by the method of bonding, the device 150 may be used in higher powered applications.

Furthermore, the methods disclosed herein for bonding the phosphor converter body 130 to the component 120 simplify the manufacturing process. Using the disclosed method, bonding of the phosphor converter body 130 to the component 120 may be accomplished without the use of separate supports to provide a gap between the phosphor converter body 130 and the component 120, as the particles 110 allow precursor for the inorganic coating 140 to flow in between the phosphor converter body 130 and the component 120 without separate supports. Furthermore, no pretreatment or roughening of the surfaces of the phosphor converter body 130 or component 120 are required to provide surface area for the inorganic coating.

Figure 3:
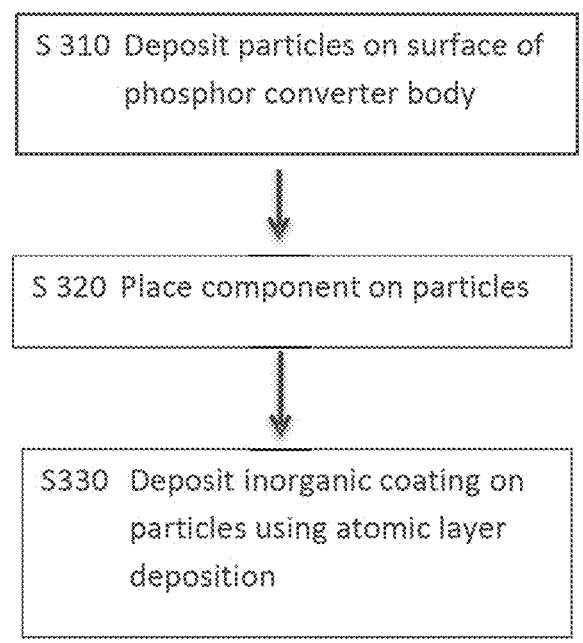
FIG. 3 is a flow diagram illustrating another embodiment of a method for bonding a phosphor converter body to a light source.

In another embodiment, as shown in FIG. 3, particles 110 may be deposited on an upper surface of a phosphor converter body 130 (S310), a component 120 is then placed on the particles 110 such that a lower surface of component 120 facing the phosphor converter body 130 is in contact with a portion of the particles 110 (S320), and then (S330) a thin layer of inorganic coating 140 is applied that connects particles 110 among each other and also the adjacent phosphor converter body 130 and component 120, resulting in a device 150 (FIG. 1) in which the phosphor converter body is bound to the component 120.

Figure 4:
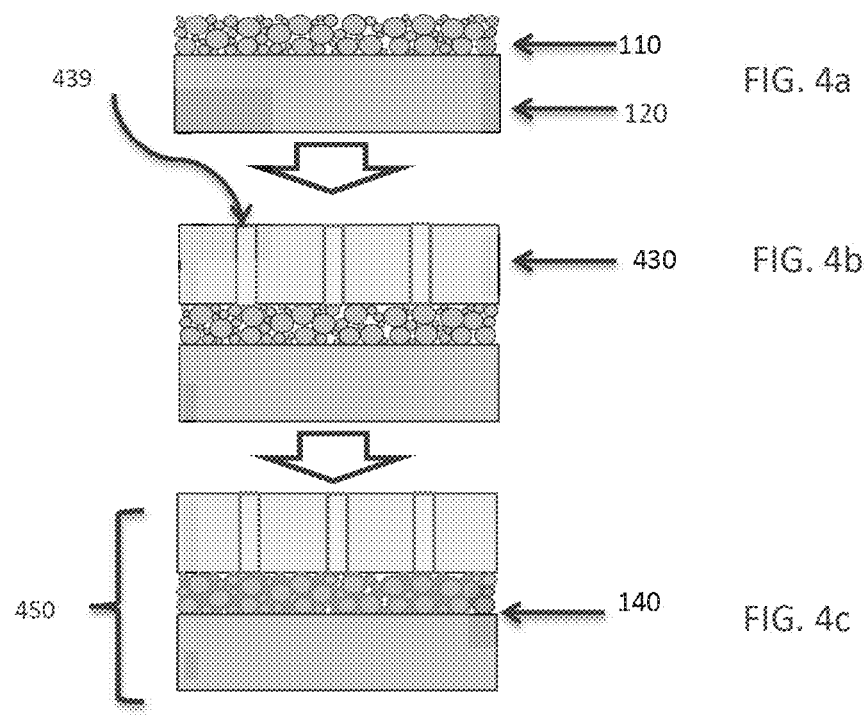
FIGS. 4a-4c illustrate bonding of a phosphor converter body having holes to a light source.

In another embodiment, as shown in FIGS. 4a-4c, the phosphor converter body 430 may include small holes 439 through the thickness of the phosphor converter body 430 to allow precursor gases for the ALD to flow between the phosphor converter body 430 and the component 120, and into the layer of particles 110. Such small holes 439 may be formed by any suitable means, for example, with a laser. Such holes may have a diameter of, for example, of 100 nm to 100 µm.

Particles

Figure 5:
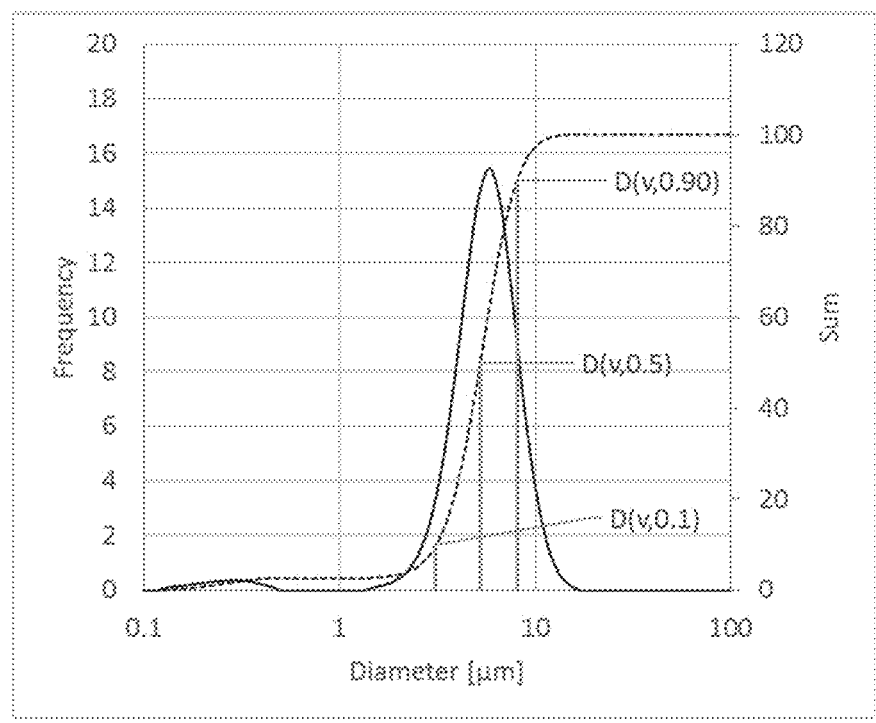
FIG. 5 is a graph showing a particle size distribution for a phosphor powder.

The particles 110 may have, for example, a D50 value of >0.2 µm and <20 µm, in some embodiments the particles 110 may have, for example, a D50 value of >1 µm and <10 µm. Here, D represents the diameter of powder particles, and D50 means a cumulative 50% point of diameter (or 50% pass particle size) and may be referred to as an average particle size or median diameter. D50 values for particles may be provided by the supplier of the powder particle material or may be measured. For example, FIG. 5 shows a measured particle size distribution of a garnet phosphor powder analyzed using a PA-950 laser particle size analyzer from Horiba Company, with a measuring range of 0.01 µm to 3000 µm. The measurement principle is based on the measurement of the pattern of scattered light in a wide angular range. This distribution of scattered light is used to calculate the particle size distribution using Mei's theory, as is understood by a person of ordinary skill in the art. In the data shown in FIG. 4, D(v, 0.1)=3.10017 (µm), D(v, 0.5), which is D50,=5.26114 (µm), and D(v, 0.9)=8.17130 (µm), where D(v, x.x) defines the particle sizes for the cumulative particle volumes of 10%, 50% and 90% of the distribution. The particle size of particles 110 may be chosen to promote scattering of light when component 120 is a light source to allow for high light output coupling.

The layer of particles 110 may be thick enough to contain multiple layers of phosphor grains and/or voids. This layer, however, should not be so thick as to fulfill the entire converter function. A distance D (FIG. 1c) between the upper surface 125 of the component 120 and the lower surface 135 of the phosphor converter body 130 in device 150 may be, for example, in the range 100 nm to 5 µm. In case of particles 110 formed of a luminescent material (as described below), the thickness D may be in the range of 1 µm to 20 µm.

Particles 110 may be deposited on component 120 using any applicable technique, such as sedimentation, electrophoretic deposition (EPD), electo stenciling, electro static dusting, dispensing in a volatile medium, or the like.

The particles 110 may be made from materials that are close to or matched to the index of refraction of materials used in the phosphor converter body 130 to facilitate light transmission.

The particles 110 may be made of non-luminescent materials, and may be non-absorbing or nearly non-absorbing metal oxide material so as to act as a scattering layer to enhance the out coupling efficiency and the thermal conductivity from component 120. Examples of materials used to form such particles include $Al_2O_3$, $SiO_2$, $MgO_2$, $SnO_2$, $TiO_2$, and $ZnO_2$.

The particles 110 may be made of luminescent materials. For example, the particles 110 may be made from the same phosphor converter material as used in the phosphor converter body 130. When made from luminescent material used in the phosphor converter body 130, the layer of particles 110 may be kept small enough (i.e., the value of D low enough) so as to not fulfill the converter function.

The particles 110 may be made of a luminescent material that is different from the material in the phosphor converter body. For example, particles 110 may be a material that shows a red shift conversion (longer wavelength) as compared to the phosphor converter material used to form the phosphor converter body 130. The converted light from the particles 100 is not absorbed in the phosphor converter body 130. The combination of different materials in the phosphor converter body and in the particles 110 allows for a wide emission spectrum modification.

Luminescent materials that may be used for particles 110 include SCASN and 258 type phosphors, SLA type phosphors, garnet phosphors, and Mn(V) doped fluorides as described below.

SCASN and 258 Type Phosphors:

$(Ba,Sr,Ca)AlSiN_3$:Eu and $(Ba,Sr,Ca)_2Si_{5-x}Al_xO_xN_{8-x}$:Eu: In these compounds, europium (Eu) is substantially or only divalent, and replaces one or more of the indicated divalent cations.

In general, Eu will not be present in amounts larger than 10% of the cation, especially in the range of about 0.5-10%, more especially in the range of about 0.5-5% relative to the cation(s) it replaces. The term ":Eu" or ":$Eu^{2+}$", indicates that part of the metal ions is replaced by Eu (in these examples by $Eu^{2+}$). For instance, assuming 2% Eu in $CaAlSiN_3$:Eu, the correct formula could be $(Ca_{0.98}Eu_{0.02})AlSiN_3$. Divalent europium will in general replace divalent cations, such as the above divalent alkaline earth cations, especially Ca, Sr or Ba.

Further, the material $(BaSrCa)_2Si_{5-x}Al_xO_xN_{8-x}$:Eu can also be indicated as $M_2Si_{5-x}Al_xO_xN_{8-x}$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50-100%, especially 50-90% Ba and 50-0%, especially 50-10% Sr, such as $Ba_{1.5}Sr_{0.5}Si_5N_8$:Eu, (i.e. 75% Ba; 25% Sr). Here, Eu is introduced and replaces at least part of M i.e. one or more of Ba, Sr, and Ca). Likewise, the material $(Sr,Ca,Mg)AlSiN_3Eu$ can also be indicated as $MAlSiN_3Eu_5$ wherein M is one or more elements selected from the group consisting of magnesium (Mg) strontium (Sr) and calcium (Ca); especially, M comprises in this compound calcium or strontium, or calcium and strontium, more especially calcium. Here, Eu is introduced and replaces at least part of M (i.e. one or more of Mg, Sr, and Ca). Preferably, in an embodiment the first red luminescent material comprises $(Ca,Sr,Mg)AlSiN_3$:Eu, preferably $CaAlSiN_3$:Eu. Further, in another embodiment, which may be combined with the former, the first red luminescent material comprises $(Ca,Sr,Ba)_2Si_{5-x}Al_xO_xN_{8-x}$:Eu, preferably $(Sr,Ba)_2Si_5N_8$:Eu. The terms "(Ca,Sr,Ba)" indicate that the corresponding cation may be occupied by calcium, strontium or barium. It also indicates that in such material corresponding cation sites may be occupied with cations selected from the group consisting of calcium, strontium and barium. Thus, the material may for instance comprise calcium and strontium, or only strontium, etc.

SLA Type Phosphors $M_{1-x-y-z}Z_zA_aB_bC_cD_dE_eN_{4-n}O_n$:$ES_x$,$RE_y$, with M=selected from the group consisting of Ca (calcium), Sr (strontium), and Ba (barium); Z selected from the group consisting of monovalent Na (sodium), K (potassium), and Rb (rubidium); A=selected from the group consisting of divalent Mg (magnesium), Mn (manganese), Zn (zinc), and Cd (cadmium) (especially, A=selected from the group consisting of divalent Mg (magnesium), Mn (manganese), and Zn (zinc), even more especially selected from the group consisting of divalent Mg (magnesium), Mn (manganese); B=selected from the group consisting of trivalent B (boron), Al (aluminum) and Ga (gallium); C=selected from the group consisting of tetravalent Si (silicon), Ge (germanium), Ti (titanium) and Hf (hafnium); D selected from the group consisting of monovalent Li (lithium), and Cu (copper); E selected for the group consisting of P (the element phosphor), V (vanadium), Nb (niobium), and Ta (tantalum); ES=selected from the group consisting of divalent Eu (europium), Sm (samarium) and ytterbium, especially selected from the group consisting of divalent Eu and Sm; RE=selected from the group consisting of trivalent Ce (cerium), Pr (praseodymium), Nd (neodymium), Sm (samarium), Eu (europium), Gd (gadolinium), Tb (terbium), Dy (dysprosium), Ho (holmium), Er (erbium), and Tm (thulium); with $0 \le x \le 0.2$; $0 \le y \le 0.2$; $0<x+y \le 0.4$; $0 \le z<1$; $0 \le n \le 0.5$; $0 \le a \le 4$ (such as $2 \le a \le 3$); $0 \le b \le 4$; $0 \le c \le 4$; $0 \le d \le 4$; $0 \le e \le 4$; $a+b+c+d+e=4$; and $2a+3b+4c+d+5e=10-y-n+z$. Especially, $z \le 0.9$, such as $z \le 0.5$. Further, especially $x+y+z \le 0.2$.

The equations $a+b+c+d+e=4$; and $2a+3b+4c+d+5e=10-y-n+z$, respectively, especially determine the Z, A, B, C, D and E cations and O and N anions in the lattice and thereby define (also) the charge neutrality of the system. For instance, the charge compensation is covered by the formula $2a+3b+4c+d+5e=10-y-n+z$. It covers e.g. charge compensation by decreasing O content or charge compensation by substituting a C cation by a B cation or a B cation by an A cation, etc. For example: $x=0.01$, $y=0.02$, $n=0$, $a=3$; then $6+3b+4c=10-0.02$; with $a+b+c=4$: $b=0.02$, $c=0.98$.

As will be clear to a person skilled in the art, a, b, c, d, e, n, x, y, z are always equal to or larger than zero. When a is defined in combination with the equations $a+b+c+d+e=4$; and $2a+3b+4c+d+5e=10-y-n+z$, then in principle, b, c, d, and e do not need to be defined anymore. However, for the sake of completeness, herein also $0 \le b \le 4$; $0 \le c \le 4$; $0 \le d \le 4$; $0 \le e \le 4$; are defined.

Assume a system like $SrMg_2Ga_2N_4$:Eu. Here, $a=2$, $b=2$, $c=d=e=y=z=n=0$. In such system, $2+2+0+0+0=4$ and $2*2+3*2+0+0+0=10-0-0+0=10$. Hence, both equations are complied with. Assume that 0.5 O is introduced. A system with 0.5 O can e.g. be obtained when 0.5 Ga—N is replaced by 0.5 Mg—O (which is a charge neutral replacement). This would result in $SrMg_{2.5}Ga_{1.5}N_{3.5}O_{0.5}$:Eu. Here, in such system $2.5+1.5+0+0+0=4$ and $2*2.5+3*1.5+0+0+0=10-0-0.5+0=9.5$. Hence, also here both equations are complied with.

As indicated above, in an advantageous embodiment $d>0$ and/or $z>0$, especially at least $d>0$. Especially, the phosphor comprises at least lithium.

In yet another embodiment, $2 \le a \le 3$, and especially also $d=0$, $e=0$ and $z=0$. In such instances, the phosphor is amongst others characterized by $a+b+c=4$; and $2a+3b+4c=10-y-n$.

In a further specific embodiment, which may be combined with the former embodiments $e=0$. In yet a further specific embodiment, which may be combined with the former embodiments, M is Ca and/or Sr.

Hence, in a specific embodiment, the phosphor has the formula $M(Ca \text{ and/or } Sr)_{1-x-y}Mg_aAl_bSi_cN_{4-n}O_n$:$ES_x$,$RE_y$ (I), with ES=selected from the group consisting of divalent Eu (europium) or Sm (samarium) or Yb (ytterbium); RE=selected from the group consisting of trivalent Ce (cerium), Pr (praseodymium), Nd (neodymium), Sm (samarium), Eu (europium), Gd (gadolinium), Tb (terbium), Dy (dysprosium), Ho (holmium), Er (erbium), and Tm (thulium), wherein $y/x<0.1$, especially $<0.01$, and $n \le 0.1$, especially $<0.01$, even more especially $<0.001$, yet even more especially $<0.0001$. Hence, in this embodiment, substantially samarium and or europium containing phosphors are described. For instance, when divalent Eu is present, with $x=0.05$, and for instance y1 for Pr may be 0.001, and y2 for Tb may be 0.001, leading to an $y=y1+y2=0.002$. In such instance, $y/x=0.04$. Even more especially, $y=0$. However, as indicated elsewhere when Eu and Ce are applied, the ratio y/x may be larger than 0.1.

The condition $0<x+y \le 0.4$ indicates that M may be substituted with in total up to 40% of ES and/or RE. The condition "$0<x+y \le 0.4$" in combination with x and y being between 0 and 0.2 indicates that at least one of ES and RE are present. Not necessarily both types are present. As indicated above, both ES and RE may each individually refer to one or more subspecies, such as ES referring to one or more of Sm and Eu, and RE referring to one or more of Ce, Pr, Nd, Sm, Eu, Gd, Tb, Dy, Ho, Er, and Tm.

Especially, when europium is applied as divalent luminescent species or dopant, the molar ratio between samarium and europium (Sm/Eu) is <0.1, especially <0.01, especially <0.001.

The same applies when europium in combination with ytterbium would be applied. When europium is applied as divalent luminescent species or dopant, the molar ratio between ytterbium and europium (Yb/Eu) is <0.1, especially <0.01, especially <0.001. Would all three together be applied, then the same molar ratios might apply, i.e. ((Sm+Yb)/Eu) is <0.1, especially <0.01, especially <0.001.

Especially, x is in the range of 0.001-0.2 (i.e. $0.001 \leq x \leq 0.2$), like 0.002-0.2, such as 0.005-0.1, especially 0.005-0.08. Especially in the case of divalent Europium in the herein described systems, the molar percentage may be in the range of 0.1-5% ($0.001 \leq x \leq 0.05$), such as 0.2-5%, like 0.5-2%. For other luminescent ions, x may (but is not necessarily) in embodiments be equal to or larger than 1% (x equal to or larger than 0.01).

In a specific embodiment, the phosphor is selected from the group consisting of $(Sr,Ca)Mg_3SiN_4$:Eu, $(Sr,Ca)Mg_2Al_2N_4$:Eu, $(Sr,Ca)LiAl_3N_4$:Eu and $(Sr,Ca)Li_dMg_aAl_bN_4$:Eu, with a, b, d as defined above.

As also indicated herein, the notation "(Sr,Ca)", and similar notations with other elements, indicates that the M-positions are occupied with Sr and/or Ca cations (or other elements, respectively).

In a further specific embodiment the phosphor is selected from the group consisting of $Ba_{0.95}Sr_{0.05}Mg_2Ga_2N_4$:Eu, $BaMg_2Ga_2N_4$:Eu, $SrMg_3SiN_4$:Eu, $SrMg_2Al_2N_4$:Eu, $SrMg_2Ga_2N_4$:Eu, $BaMg_3SiN_4$:Eu, $CaLiAl_3N_4$:Eu, $SrLiAl_3N_4$:Eu, $CaLi_{0.5}MgAl_{2.5}N_4$:Eu, and $SrLi_{0.5}MgAl_{2.5}N_4$:Eu.

Further (non-limiting) examples for such phosphors are e.g. $(Sr_{0.8}Ca_{0.2})_{0.995}LiAl_{2.91}Mg_{0.09}N_{3.91}O_{0.09}$:Eu$_{0.005}$; $(Sr_{0.9}Ca_{0.1})_{0.905}Na_{0.09}LiAl_3N_{3.91}O_{0.09}$:Eu$_{0.005}$; $(Sr_{0.8}Ca_{0.3}Ba_{0.17})_{0.989}LiAl_{2.99}Mg_{0.01}N_4$:Ce$_{0.01}$,Eu$_{0.001}$; $Ca_{0.995}LiAl_{2.995}Mg_{0.005}N_{3.995}O_{0.005}$:Yb$_{0.005}$ (YB(II)); $Na_{0.995}MgAl_3N_4$:Eu$_{0.005}$; $Na_{0.895}Ca_{0.1}Mg_{0.9}Li_{0.1}Al_3N_4$:Eu$_{0.005}$; $Sr_{0.99}LiMgAlSiN_4$:Eu$_{0.01}$; $Ca_{0.995}LiAl_{2.955}Mg_{0.045}N_{3.96}O_{0.04}$:Ce$_{0.005}$; $(Sr_{0.9}Ca_{0.1})_{0.998}Al_{1.99}Mg_{2.01}N_{3.99}O_{0.01}$:Eu$_{0.002}$; $(Sr_{0.9}Ba_{0.1})_{0.998}Al_{1.99}Mg_{2.01}N_{3.990}O_{0.01}$:Eu$_{0.002}$.

In a further specific embodiment, the phosphor is selected from the group consisting of $(Sr,Ca)Mg_3SiN_4$:Eu and $(Sr,Ca)Mg_2Al_2N_4$:Eu. In yet another specific embodiment, the phosphor is selected from the group consisting of $Ba_{0.95}Sr_{0.05}Mg_2Ga_2N_4$:Eu, $BaMg_2Ga_2N_4$:Eu, $SrMg_3SiN_4$:Eu, $SrMg_2Al_2N_4$:Eu, $SrMg_2Ga_2N_4$:Eu, and $BaMg_3SiN_4$:Eu. Especially, these phosphors, and even more especially $(Sr,Ca)Mg_3SiN_4$:Eu and $(Sr,Ca)Mg_2Al_2N_4$:Eu may be phosphors having good luminescent properties, amongst others in terms of spectral position and distribution of the luminescence.

Of especial interest are phosphors wherein the phosphor complies with $0 \leq x \leq 0.2$, y/x<0.1, M comprises at least Sr, $z \leq 0.1$, $a \leq 0.4$, $2.5 \leq b \leq 3.5$, B comprises at least Al, $c \leq 0.4$, $0.5 \leq d \leq 1.5$, D comprises at least Li, $e \leq 0.4$, $n \leq 0.1$, and wherein ES at least comprises Eu.

Especially, $y+z \leq 0.1$. Further, especially $x+y+z \leq 0.2$. Further, especially a is close to 0 or zero. Further, especially b is about 3. Further, especially c is close to 0 or zero. Further, especially d is about 1. Further, especially e is close to 0 or zero. Further, especially n is close to 0 or zero. Further, especially y is close to 0 or zero.

Especially good systems, in terms of quantum efficiency and hydrolysis stability are those with z+d>0, i.e. one or more of Na, K, Rb, Li and Cu(I) are available, especially at least Li, such as e.g. $(Sr,Ca)LiAl_3N_4$:Eu and $(Sr,Ca)Li_dMg_aAl_bN_4$:Eu, with a, b, d as defined above. In a further specific embodiment the phosphor is selected from the group consisting of $CaLiAl_3N_4$:Eu, $SrLiAl_3N_4$:Eu, $CaLi_{0.5}MgAl_{2.5}N_4$:Eu, and $SrLi_{0.5}MgAl_{2.5}N_4$:Eu.

Further phosphors of special interest are $(Sr,Ca,Ba)(Li,Cu)(Al,B,Ga)_3N_4$:Eu, which comprises as M ion at least Sr, as B ion at least Al, and as D ion at least Li.

Garnet Phosphors $A_3B_5O_{12}$:Ce$^{3+}$, wherein A is selected from the group consisting of Sc, Y, Tb, Gd, and Lu, wherein B is selected from the group consisting of Al and Ga. Preferably, M at least comprises one or more of Y and Lu, and wherein B at least comprises Al. These types of materials may give highest efficiencies. In a specific embodiment, the second luminescent material comprises at least two luminescent materials of the type of $A_3B_5O_{12}$:Ce$^{3+}$, wherein A is selected from the group consisting of Y and Lu, wherein B is selected from the group consisting of Al, and wherein the ratio Y:Lu differ for the at least two luminescent materials. For instance, one of them may be purely based on Y, such as $Y_3Al_5O_{12}$:Ce$^{3+}$, and one of them may be a Y,Lu based system, such as $(Y_{0.5}Lu_{0.5})_3Al_5O_{12}$:Ce$^{3+}$. Embodiments of garnets especially include $A_3B_5O_{12}$ garnets, wherein A comprises at least yttrium or lutetium and wherein B comprises at least aluminum. Such garnet may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3Al_5O_{12}$:Ce, wherein x is equal to or larger than 0 and equal to or smaller than 1. The terms ":Ce" or ":Ce$^{3+}$" (or similar terms), indicate that part of the metal ions (i.e. in the garnets: part of the "M" ions) in the luminescent material is replaced by Ce (or another luminescent species when the term(s) would indicate that, like ":Yb"). For instance, assuming $(Y_{1-x}Lu_x)_3Al_5O_{12}$:Ce, part of Y and/or Lu is replaced by Ce. This notation is known to the person skilled in the art. Ce will replace M in general for not more than 10%; in general, the Ce concentration will be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art.

Mn(IV) Doped Fluorides:

A red luminescent material is of the type $M_2AX_6$ doped with Mn$^{4+}$ (i.e. at the A position), wherein M comprises monovalent cations, selected from the group consisting of Li, Na, K, Rb, Cs, NH$_4$, especially at least comprising potassium (K), wherein A comprises a tetravalent cation selected from the group consisting of Si, Ti, Ge, Sn, and Zr, especially at least comprising silicon (Si), and wherein X comprises a monovalent anion selected from the group consisting of F, Cl, Br and I, but at least comprising F. In this context, the phrase "at least comprising" especially refers to embodiments wherein the specific species may comprise one or more of the indicated species, but at least the species that is indicated with "at least comprising". To give an example, when M at least comprises K, this may imply embodiments wherein the species or monovalent cation M (or the host lattice position(s) of M) include >0% of the K, up to 100%. Hence, e.g. the following embodiments are included: $(K_{0.01}Rb_{0.99})SiF_6$:Mn, $RbKSiF_6$:Mn, and $K_2SiF_6$:Mn, etc. etc.

As known in the art, the phrase "$M_2AX_6$ doped with $Mn^{4+}$" can also be indicated as $M_2AX_6$:$Mn^{4+}$. Here, The term ":Mn" or ":$Mn^{4+}$", indicates that part of the tetravalent A ions is replaced by tetravelent Mn. The term "tetravalent manganese" refers to $Mn^{4+}$. This is a well-known luminescent ion. In the formula as indicated above, part of the tetravalent cation A (such as Si) is being replaced by manganese. Hence, $M'_xM_{2-2x}AX_6$ doped with tetravalent manganese may also be indicated as $M'_xM_{2-2x}A_{1-m}Mn_mX_6$. The mole percentage of manganese, i.e. the percentage it replaces the tetravalent cation A will in general be in the range of 0.1-15%, especially 1-12%, i.e. m is in the range of 0.001-0.15, especially in the range of 0.01-0.12.

A comprises a tetravalent cation, and especially at least comprises silicon. A may optionally further comprise one or more of titanium (Ti), germanium (Ge), stannum (Sn) and zinc (Zn). Preferably, at least 80%, even more preferably at least 90%, such as at least 95% of M consists of silicon. Hence, in a specific embodiment, $M_2AX_6$ may also be described as $M_2A_{1-m-t-g-s-zr}Mn_mTi_tGe_gSn_sZr_zX_6$, wherein m is as indicated above, and wherein t,g,s,zr are each individually preferably in the range of 0-0.2, especially 0-0.1, even more especially 0-0.05, wherein t+g+s+zr is smaller than 1, especially equal to or smaller than 0.2, preferably in the range of 0-0.2, especially 0-0.1, even more especially 0-0.05, and wherein A is especially Si.

As indicated above, M relates to monovalent cations, but especially at least comprises one or more of potassium and rubidium. Other monovalent cations that may further be comprised by M can be selected from the group consisting of lithium (Li), sodium (Na), cesium (Cs) and ammonium ($NH_4^+$). Preferably, at least 80%, even more preferably at least 90%, such as 95% of M consists one or more of potassium and rubidium. In a specific embodiment, $M_2AX_6$ can also be described $(K_{1-r-l-n-c-nh}Rb_rLi_lNa_nCs_c(NH_4)_{nh})_2AX_6$, wherein r is in the range of 0-0.8 (and wherein the ratio potassium-rubidium is preferably as indicated before), wherein l,n,c,nh are each individually preferably in the range of 0-0.2, especially 0-0.1, even more especially 0-0.05, and wherein l+n+c+nh is smaller than 1, especially equal to or smaller than 0.2, preferably in the range of 0-0.2, especially 0-0.1, even more especially 0-0.05. Hence, the invention also provides $(K_{1-r-l-n-c-nh}Rb_rLi_lNa_nCs_c(NH_4)_{nh})_2AX_6$:Mn and similar narrow bad luminescent materials.

As indicated above, X relates to a monovalent anion, but at least comprises fluorine. Other monovalent anions that may optionally be present may be selected from the group consisting of chlorine (Cl), bromine (Br), and iodine (I). Preferably, at least 80%, even more preferably at least 90%, such as 95% of X consists of fluorine. Hence, in a specific embodiment, $M_2AX_6$ can also be described as $M_2A(F_{1-cl-b-i}Cl_{cl}Br_bI_i)_6$, wherein cl,b,i are each individually preferably in the range of 0-0.2, especially 0-0.1, even more especially 0-0.05, and wherein cl+b+i is smaller than 1, especially equal to or smaller than 0.2, preferably in the range of 0-0.2, especially 0-0.1, even more especially 0-0.05.

Hence, $M_2AX_6$ can also be described $(K_{1-r-l-n-c-nh}Rb_rLi_lNa_nCs_c(NH_4)_{nh})_2Si_{1-m-t-g-s-zr}Mn_mTi_tGe_gSn_sZr_{zr}(F_{1-cl-b-i}Cl_{cl}Br_bI_i)_6$, with the values for r,l,n,c,nh,m,t, g,s,zr,cl,b,i as indicated above. Hence, the invention also provides $(K_{1-r-l-n-c-nh}Rb_rLi_lNa_nCs_c(NH_4)_{nh})_2Si_{1-m-t-g-s-zr}Mn_mTi_tGe_gSn_sZr_{zr}(F_{1-cl-b-i}Cl_{cl}Br_bI_i)_6$:Mn and similar narrow bad luminescent materials. Especially however, the second source of red light comprises said second red luminescent material comprising $K_2SiF_6$:Mn.

As manganese replaces part of a host lattice ion and has a specific function, it is also indicated as "dopant" or "activator". Hence, the hexafluorosilicate is doped or activated with manganese ($Mn^{4+}$).

Inorganic Coating

The inorganic coating 140 may be deposited by Atomic Layer Deposition (ALD). ALD is a pulsed chemical vapor deposition (CVD) process which allows the growth of thin layers by applying one atomic layer of a material per cycle. Such process is self-limiting allowing very controlled and conformal coatings even on particles as shown in FIG. 1c.

The ALD reaction is split in (at least) two parts. In a first step a metal (oxide) precursor is fed into the reactor and adsorbs and/or reacts with reactive groups on the surfaces, and then substantially all non-reacted or adsorbed precursor molecules are removed by reactor purging. In a second step the oxygen source is fed into the reactor and reacts with the metal source on the particle surfaces, followed by purging of the reactor to remove substantially all remaining oxygen source molecules and hydrolysis products formed by condensation reactions. A prototypical two part ALD reaction using trimethylaluminum (TMA) to form Al2O3 is illustrated in FIG. 6.

The two steps lead to formation of an atomic layer (or monolayer) because of the self-limiting nature of the surface reaction. These atomic layer reaction steps are repeated multiple times to form the final ALD coating.

Because the reaction in ALD is self-terminating, the technique allows waiting times until an atomic layer is completed without creating the second layer of atoms in other regions. Therefore, ALD is a technique in which conformal and high quality coatings can be reached even on surfaces or gaps with large aspect-ratio, which makes the process in particular suitable for depositing an inorganic coating 140 that covers the space between the particles 100, the component 120 and the phosphor converter body 130.

ALD can be performed at low temperatures (50° C.-350° C.) and therefore is compatible with a variety of materials, including, for example, LED materials such as silicones. Typical purge times are in the range of 2 sec to 60 sec.

The term metal oxide precursor especially indicates a precursor of the metal oxide. The precursor itself may not be a metal oxide, but may, e.g., include metal organic molecules. Hence, especially the metal (oxide) precursors for ALD may typically include metal halides, alkoxides, amides, and other metal (organic) compounds.

The inorganic coating 140 may be $Al_2O_3$. An $Al_2O_3$ layer may be deposited by using an $Al(CH_3)_3$ (TMA), AlCl3 or $HAl(CH_3)_2$ precursor in combination with a water, ozone, or oxygen source. Additional details of forming $Al_2O_3$ coatings using ALD may be found in *Dillon, Ott, Way, and George, Surface Science,* 322 (1995) 230-242.

In a further embodiment the inorganic coating 140 may be formed with another material such $SiO_2$, $SnO_2$, $CrO_2$, $ZrO_2$, $HfO_2$, $Ta_2O_5$, $TiO_2$, ZnO, TiN, TaN, $V_2O_5$, $PtO_2$, $B_2O_3$, CdS using ALD with precursors and methods understood by persons having ordinary skill in the art. The inorganic coating 140 may be formed by a combination of metal oxide materials by forming a multilayer structure.

Phosphor Converter Body

The phosphor converter body 130 may be any self-supporting body containing a phosphor. For example, the phosphor converter body 130 may be a phosphor contained in a glass or a silicone matrix and formed into a plate, platelet or other shape. The phosphor converter body 130 may be Lumiramic™, which is a ceramic phosphor tile or plate. Such a ceramic phosphor tile is a free-standing polycrystalline material that is manufactured by means of ceramic processing which may include steps of powder pressing/consolidation followed by sintering and mechanical treatment such as dicing, grinding or polishing. The sintering step fuses the ceramic phosphor particles together to form a polycrystalline body or ceramic tile. U.S. patent application 2018/0122993, incorporated herein by reference in its entirety, further describes various types of Lumiramic™ that may be used as the phosphor converter body 130.

Component

Component 120 may be a substrate, for example a transparent glass, a sapphire or silicon substrate or a reflective substrate, and a phosphor converter body 130 bound to such substrate then may be used to form another device.

Component 120 may be a light source, for example a light emitting diodes. In a device 150 in which component 120 is a light source such a light emitting diode, light emitted by the light source is absorbed by the phosphor in the phosphor converter body 130 and emitted from the device at a different wavelength.

Component 120 may be a light emitting diode such as a III-nitride LED that emits blue or UV light, however semiconductor light emitting devices besides LEDs, such as laser diodes and semiconductor light emitting devices made from other materials systems such as other III-V materials, III-phosphide, III-arsenide, II-VI materials, ZnO, or Si-based materials may be used.

Such light emitting diodes may be formed on various substrates, for example, sapphire, SiC, Si, GaN, or a composite substrate, which substrates are the surface 125 of component 120 on which the particles are deposited (FIG. 1a).

EXAMPLE

While the method is generally applicable to different emitter architectures, it is particularly useful in bonding ceramic cover plates (Lumiramic™) to GaN or Sapphire substrates. In an example, a Lumiramic tile was bonded to an LED having a GaN layer surface. Particles of $Al_2O_3$ having a D50 value of 1 µm were deposited on an LED die using sedimentation. The particle layer was approximately 3 µm thick. After drying, Lumiramic™ tile formed of YAG was positioned on the layer of particles.

An $Al_2O_3$ coating was then applied in a Picosun Oy ALD reactor. Precursor materials were trimethylaluminum (STREM, Product No. 93-1369) and $H_2O$, to make the $Al_2O_3$ film. The deposition temperature was set to 150° C. The pulse time in which precursor was introduced was 100 ms, followed by a purge with nitrogen gas of 30 seconds, followed by a pulse of gas-phase water for 100 ms, followed by another purge of nitrogen gas for 30 seconds. Time was allowed after the pulse for all of the precursor to react with the particles, Lumiramic, and LED surfaces. The cycle was repeated to form an $Al_2O_3$ inorganic coating with a film thickness of between 50 nm and 500 nm.

The invention claimed is:

1. A device comprising:
   a component having a component surface;
   a phosphor converter body bonded to the component and having a phosphor converter body surface facing the component surface; and
   a bonding layer between the component and the phosphor converter body, the bonding layer comprising
     a plurality of particles between and in contact with the component surface and the phosphor converter body surface; and
     an inorganic coating on and in contact with at least a portion of the particles, at least a portion of the component surface, and at least a portion of the phosphor converter body surface.

2. The device of claim 1, wherein the particles have a size of between D50>0.2 µm and <20 µm.

3. The device of claim 1, wherein the particles comprise a non-luminescent material.

4. The device of claim 3, wherein the particles comprise at least one of $Al_2O_3$, $SiO_2$, $MgO_2$, $SnO_2$, $TiO_2$, or $ZnO_2$.

5. The device of claim 1, wherein the particles comprise a luminescent material.

6. The device of claim 5, wherein the luminescent material is a same material as in the phosphor converter body.

7. The device of claim 1, wherein a distance between the component surface and the phosphor converter body surface is between 0.2 µm and 30 µm.

8. The device of claim 1, wherein the inorganic coating comprises a metal oxide.

9. The device of claim 1, wherein the inorganic coating comprises at least one of $Al_2O_3$, $SiO_2$, $SnO_2$, $CrO_2$, $ZrO_2$, $HfO_2$, $Ta_2O_5$, $TiO_2$, $ZnO$, $TiN$, $TaN$, $V_2O_5$, $PtO_2$, $B_2O_3$, or CdS.

10. The device of claim 1, wherein the inorganic coating has a thickness of between 50 nm and 500 nm.

11. The device of claim 1, wherein the phosphor converter body is a ceramic phosphor tile.

12. The device of claim 1, wherein the component comprises a light emitting diode and the upper surface is GaN.

13. A method comprising:
   depositing a plurality of particles onto a surface of a component;
   placing a phosphor converter body on the particles opposite the component; and
   depositing an inorganic coating onto the particles between a component and the phosphor converter body using atomic layer deposition.

14. The method of claim 13, wherein the particles have a size D50 of >0.2 µm and <20 µm.

15. The method of claim 13, wherein the inorganic coating has a thickness between 50 nm and 500 nm and comprises at least one of $Al_2O_3$, $SiO_2$, $SiO_2$, $SnO_2$, $CrO_2$, $ZrO_2$, $HfO_2$, $Ta_2O_5$, $TiO_2$, $ZnO$, $TiN$, $TaN$, $V_2O_5$, $PtO_2$, $B_2O_3$, or CdS.

* * * * *

UNITED STATES PATENT AND TRADEMARK OFFICE
CERTIFICATE OF CORRECTION

PATENT NO. : 11,257,986 B2
APPLICATION NO. : 16/867799
DATED : February 22, 2022
INVENTOR(S) : Jens Meyer, Hans-Helmut Bechtel and Matthias Heidemann It is certified that error appears in the above-identified patent and that said Letters Patent is hereby corrected as shown below:

In the Claims

In Claim 13, 7th Line (Column 12 Line 53):
Please replace "a component" with --the component--

Signed and Sealed this
Twenty-third Day of April, 2024

Katherine Kelly Vidal
*Director of the United States Patent and Trademark Office*